United States Patent [19]

Schnoeller et al.

[11] Patent Number: 4,914,565
[45] Date of Patent: Apr. 3, 1990

[54] PIEZO-ELECTRIC TRANSDUCER HAVING ELECTRODES THAT ADHERE WELL BOTH TO CERAMIC AS WELL AS TO PLASTICS

[75] Inventors: Manfred Schnoeller, Haimhausen; Jutta Mohaupt, Munich; Wolfram Wersing, Kirchheim; Karl Lubitz, Ottobrunn, all of Fed. Rep. of Germany

[73] Assignee: Siemens Aktiengesellschaft, Berlin and Munich, Fed. Rep. of Germany

[21] Appl. No.: 187,337

[22] Filed: Apr. 28, 1988

[30] Foreign Application Priority Data

May 22, 1987 [DE] Fed. Rep. of Germany ....... 3717268

[51] Int. Cl.$^4$ ............................................ H04R 17/00
[52] U.S. Cl. .................................... 367/164; 310/366
[58] Field of Search ............... 310/363, 364, 324, 366, 310/800; 367/157, 160, 161, 164, 162; 29/25.35, 594, 595, 602 A

[56] References Cited

U.S. PATENT DOCUMENTS

| | | | |
|---|---|---|---|
| 3,586,889 | 6/1971 | Kolter | 310/363 |
| 3,979,565 | 9/1976 | McShane | 367/181 |
| 4,054,714 | 10/1977 | Mastrangelo | 427/214 X |
| 4,609,845 | 9/1986 | Soni et al. | 310/363 X |
| 4,677,337 | 6/1987 | Kleinschmidt et al. | 310/334 |
| 4,786,837 | 11/1988 | Kalnin et al. | 310/363 X |

FOREIGN PATENT DOCUMENTS 0154706 9/1985 European Pat. Off. .
0259813 3/1988 European Pat. Off. .
3630708 9/1986 Fed. Rep. of Germany .

OTHER PUBLICATIONS

Dr. Frieder Schuh, "Enzyklopadie Naturwissenschaft und Technik", 1976, Litton Educational Publishing, Inc.

Primary Examiner—Brian S. Steinberger
Attorney, Agent, or Firm—Hill, Van Santen, Steadman & Simpson

[57] ABSTRACT

The invention is directed to a piezo-electric transducer having electrodes that adhere well both to ceramic as well as to plastics and that are composed of intrinsically conductive plastic. The invention is also directed to a method for the manufacture thereof. A conductive polymer layer is produced on the surface of a piezo-ceramic component by chemical or anodic oxidation of a monomer. The monomers are selected from the class of 5-member heterocycles containing sulfur or nitrogen as heteroatom, or aniline, azuline, or derivatives of the said compounds. The components provided with the economical electrodes can be advantageously composed to form sandwich-like transducers having plastic intermediate layers that exhibit good electro-acoustical properties.

15 Claims, 1 Drawing Sheet

PIEZO-ELECTRIC TRANSDUCER HAVING ELECTRODES THAT ADHERE WELL BOTH TO CERAMIC AS WELL AS TO PLASTICS

BACKGROUND OF THE INVENTION

The present invention is directed to a piezo-electric transducer having electrodes that adhere well both to ceramic as well as to plastics and is also directed to a method for the manufacture thereof.

European Patent Application No. 0 154 706 discloses a piezo-electric air-ultrasound transducer. The electro-acoustic transducer is composed of ceramic lamellae that are arranged at defined spacings in planes parallel to one another. The interspaces formed by the spacings are filled with a suitable, shape-stable material.

In order to create a sandwich-like transducer structure, the individual ceramic lamellae must be connected to one another or, respectively, to the plastic filling the interspaces. The connection between the lamellae and/or plastic must also be durable. For example, the lamellae and/or plastic can be glued together.

It is known in prior art to use nickel electrodes. Nickel electrodes can be produced easily and inexpensively by chemical deposition on the ceramic surface. This type of electrode, however, exhibits poor adhesion to plastics and is therefore difficult to join thereto. But, if a sandwich structure is to be constructed, it is necessary for the electrode to be joined to plastic.

Silver electrodes (stoving silver) can be used as an alternative to nickel electrodes. Silver electrodes exhibit good adhesion to plastic, but, silver electrodes greatly increase the manufacturing costs of the product.

There is therefore a need for an economic electrode material that can adhere to ceramic and plastic.

SUMMARY OF THE INVENTION

The present invention provides a cost-beneficial electrode material that can be easily deposited on ceramic, and has good adhesion thereto, and that can also be secured to plastic compositions at the same time. Accordingly, the present invention provides a piezo-electric transducer having electrodes that adhere well both to ceramic as well as to plastics. To this end, the electrode material is an intrinsically conductive plastic.

A method for manufacturing a piezo-electric transducer having electrodes that adhere well both to ceramic and plastics is also provided. The method includes the steps of applying a monomer of an intrinsically conductive plastic to mutually opposite sides of a preferably lamina-shaped piezo-ceramic component. The monomer is then polymerized by chemical or anodic oxidation. The component is then further processed.

Preferably, the monomer is chosen from the group of compounds consisting of the class of five-membered heterocyclenes, aniline, azulene, or a derivative of these compounds containing sulfur or nitrogen as heteroatom.

Additional features and advantages of the present invention will be apparent from the detailed description of the presently preferred embodiments and the drawings.

DETAILED DESCRIPTION OF THE PRESENTLY PREFERRED EMBODIMENTS

Figure 1:
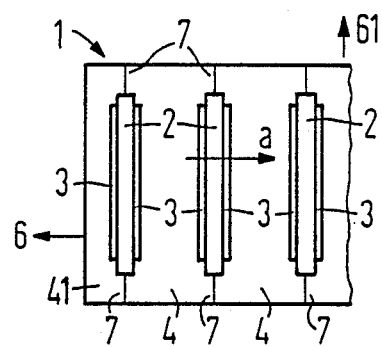
FIG. 1 illustrates a cross-sectional view of a piezo-electric transducer of the present invention.

The present invention provides a piezo-electric transducer having electrodes that adhere well both to ceramic and plastic. To accomplish this, the electrodes are constructed from an intrinsically conductive plastic. Briefly, to construct the electrode, a monomer of an intrinsically conductive plastic is applied to opposite sides of a lamina-shaped piezo-ceramic component. The monomer is then polymerized by chemical or anodic oxidation. The application of the polymer electrode on the piezo-ceramic component parts by chemical oxidation can ensue by solvent polymerization or by a gas phase reaction.

In solvent polymerization, the ceramic parts are dipped into solutions of the monomer, sprayed therewith, or moistened therewith in some other way. The ceramic parts are then subsequently treated with a solution of the corresponding oxidation agent. The oxidative polymerization thereby begins. The procedure, however, can be reversed. To this end, a solution containing the oxidation agent can be first applied to the ceramic. The ceramic is then subsequently treated with a solution of the monomer. Following the first step and subsequent, potential evaporation of the solvent, the second step can also be composed of a gas phase reaction. To that end, the ceramic parts pre-treated with the monomers or, respectively, with the oxidation agent are exposed to a vapor phase containing the oxidation agent or, respectively, the monomer.

Preferably, the monomer is selected from the group of materials consisting of the class of five-membered heterocyclenes, aniline, azulene, or derivatives thereof containing sulfur or nitrogen as heteroatom. In an embodiment, the monomer is preferably selected from pyrrole or thiophen.

Preferably, the oxidation agent consists of peroxy-acids and the salts thereof, or perchloric acids as well as the heavy metal salts. For example, peroxydisulfuric acid and the salts thereof as well as iron perchlorate are particularly suitable as oxidation agents. Peroxyborates or peroxychromates are also preferably used as the oxidation agent. Permanganates are also suitable when slight quantities of acid are added thereto. The employment of hydrogen peroxide in combination with the presence of conductive salts is also possible as the oxidation agent. The solution of the oxidation agent preferably ensues in water, potentially in mixture with organic solvents mixable with water or in purely organic solvents as well.

The oxidation agents can be potentially applied to the surface of the ceramic parts together with a conducting salt, whereby the conducting salts are also referred to as complexing or doping agents. For example, organic sulfates, sulfonic acids or inorganic salts such as lithium perchlorate, potassium tetrafluoroborate, potassium hexafluorozirconate, iron (III) chloride or hexafluorophosphate have proven effective for this purpose. The concentration of the conducting salts is chosen such that at least 1 mol of conducting salt is used to 3 mol of the monomer used or of the mixtures of the monomers. When, for example, this conducting salt is iron (III) chloride or iron perchlorate, then such compounds are conducting salts and oxidation agents at the same time.

The electrochemical polymerization ensues either in the proximity of an electrode (anode) or by joining the electrode to the ceramic surface. This, however, presumes a conductive ceramic surface or at least presumes a ceramic surface that has been rendered conductive by established dopants or other auxiliaries. The current densities needed for electrochemical polymerization preferably lie between approximately 10 and about 100 A/m$^2$.

All of the processes with the exception of the gas phase reactions can readily proceed at room temperature.

Electrodes applied in this fashion exhibit extremely good adhesion to the ceramic material. Indeed, even highly porous ceramic materials that are extremely difficult to secure electrodes to in traditional ways, can be unproblematically contacted. Accordingly, even in the pores, the ceramic surface is thereby completely covered with a plastic layer. An extremely close and good electrical or, respectively, mechanical contact between ceramic and plastic thereby arises.

Electrodes constructed pursuant to the present invention were compared to sputtered-on electrodes. The tests demonstrated that the polarization hysteresis curves registered for the electrical properties of the electrodes constructed pursuant to the present invention are identical to those of sputtered-on electrodes that were used as a reference. This illustrates the high quality of the electrode and demonstrates that no non-conductive regions are formed at the boundary surface between the ceramic and plastic as in the case, for example, of electrodes formed of sintered silver paste.

Likewise, there is no difference, with respect to electro-mechanical properties, between component parts having traditional electrodes and components produced pursuant to the present invention. The electromechanical coupling factor and the frequency constant (product of resonant frequency and cross-section of the component part) are nearly identical in components having the plastic electrodes of the present invention and having traditional electrodes. The sole difference lies in the lower conductivity when compared to metal electrodes.

Uses as electro-mechanical transducers are therefore only meaningful given operating frequencies up to one MHz. Such component parts can be advantageously utilized as quasi-static electro-mechanical transducers for all other applications. The application of the plastic electrodes of the present invention to thin ceramic foils is especially advantageous, these thin ceramic foils being processed or, respectively, constructed in a sandwich-like manner in a plurality of layers to form larger component parts. This is carried out in order to reduce the voltage needed for the operation of the component part to a level of 5 to 10 volts used in standard electronic equipment.

The electrodes of the present invention can be just as advantageously applied to extremely porous ceramic.

The high-optical absorption of the plastic-electrodes also allows use of the component parts as pyro detectors.

The electrodes of the present invention can be inexpensively manufactured and are not vulnerable to chemicals that would attack metal electrodes. The high elasticity of the plastics of the electrodes also affords great mechanical stability to the component parts manufactured in this manner.

A number of methods are available for constructing piezo-ceramic component parts having a sandwich-like structure. The ceramic laminae having the plastic electrodes are glued in layers, for example, upon interposition of plastic foils. Given arrangement at a defined spacing on top of one another, for example, injection molding methods are available for this purpose, as is filling out the interspaces with expanded cellular material.

By way of example, and not limitation, examples of the present invention will now be set forth.

FIRST EXAMPLE

The surface of a piezo-ceramic lamina of porous lead titanate zirconate (500 μm thick) was coated with a 10% alcohol solution of iron perchlorate. After evaporation of the solvent, the lamina was exposed to a nitrogen atmosphere containing 10 percent by volume pyrrole for 30 seconds at a temperature of 150° C. A dark coating of polypyrrole was formed after a few seconds. The insoluble film had a conductivity of $10^{-2}$ S/cm.

SECOND EXAMPLE

A piezo-ceramic lamina 300 μm thick was coated with an acqueous solution that contained 10 weight percent sodium peroxide bisulphate and 5 weight percent phenol sulfonic acid. The solvent was evaporated and the material treated in this manner was then coated with a 10% (by weight) ethanolic pyrrole solution. A uniform, firmly adhering and insoluble polypyrrole film that has a specific conductivity of $0.2 \cdot 10^{-1}$ S/cm was formed.

THIRD EXAMPLE

A piezo-ceramic workpiece having an area of 3×6 cm and a thickness of 200 μm was pre-treated with peroxy-disulphate and phenolsulfonic acid as in example 2 above. After the evaporation of the water, the workpiece treated in this fashion was dipped into a solution of 1 gram pyrrole in 100 ml acetonitrile that also contained 0.5 grams phenolsuphonic acid as a conducting salt and was connected as an anode. Electrolysis was carried out for 60 minutes with a platinum cooperating electrode and with an electrode spacing of 3 cm. The current density thereby amounted to 100 A/m$^2$. After electrolysis, a black polypyrrole coating that had a conductivity of $10^{-1}$ S/cm arose on the ceramic.

FIG. 1 illustrates a sectional view of a piezo-electric transducer 1 having a sandwich structure. The ceramic laminae 2 having, for example, a thickness of 200 μm having the plastic-electrodes 3 of the present invention, are first provided with electrical terminals in an established way (not shown in the figure). Beginning with a polyethylene foil 41, a stack is constructed in a direction indicated by "a". The stack is always alternately composed of layers of polyethylene foil 4 and piezo-ceramic laminae 2; the layers thereof being hot-bonded. A firm and durable connection thereby arises between the plastic electrodes 3 and the thermal plastic polyethylene foils (4, 41). The strokes 7 indicate that the foils 41 in the stack overlap the ceramic laminae 2 and are glued to themselves or, respectively, to the next neighboring foil at the boundary lines 7. The ceramic parts are thus completely enclosed by polyethylene.

Preferred sound emission directions or, respectively, reception directions 6 or, respectively, 61, can be achieved dependent on the electrical circuitry of the electrodes 3 and dependent on the polarity of the piezo-ceramics 2.

Figure 2:
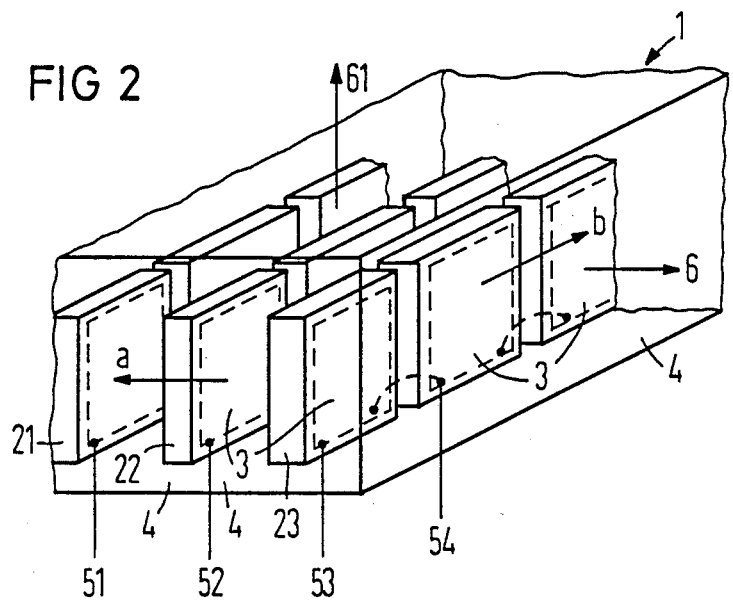
FIG. 2 illustrates a perspective view of a piezo-electric transducer of the present invention.

FIG. 2 illustrates a perspective view of a larger portion of a transducer 1 of the present invention. In addition to the construction of a stack in direction "a", a plurality of such stacks can also be arranged following one another in a direction indicated by "b". The electrical contacting of the ceramic laminae 21, 22 and 23 or, respectively, of their electrodes 3 is indicated by 51, 52 and 53. 54 indicates a possible, electrical contacting between two ceramic laminae in different stacks. The back stacks, however, can also be directly contacted as in the front stack.

It should be understood that various changes and modifications herein will be apparent to those skilled in the art. Such changes and modifications can be made without departing from the spirit and scope of the present invention and without diminishing its attendant advantages. It is therefore intended that such changes and modifications be covered by the appended claims.

We claim:

1. A method for manufacturing a piezo-electric transducer having electrodes that adhere both to ceramic and plastic comprising the steps of:
   applying a monomer of an intrinsically conductive plastic to mutually opposite sides of a lamina-shaped, piezo-ceramic component, said intrinsically conductive plastic being a plastic which is electrically conductive without the addition of electrically conductive particles;
   polymerizing the monomer by an oxidation chosen from the group consisting of chemical or anodic oxidation to produce an intrinsic conductive electrode layer; and
   joining a plurality of piezo-ceramic components to form a sandwich-like structure, the components being arranged in layers above one another at a defined spacing and interspaces are filled with a plastic.

2. The method of claim 1 wherein the monomer is chosen from the group of compounds consisting of the class of five-membered heterocyclenes, aniline, azulene, and derivatives of these compounds which contain an element chosen from the group consisting of sulfur and nitrogen as heteroatom.

3. The method of claim 2 wherein the interspaces are filled with an injection molding method.

4. The method of claim 2 wherein the interspaces are filled with expanded cellular material.

5. The method of claim 2 wherein the anodic oxidation of the monomer ensues in the presence of a conducting salt.

6. The method of claim 1 wherein the anodic oxidation of the monomer ensues in the presence of a conducting salt.

7. The method of claim 6 wherein a plurality of piezo-ceramic components are joined to form a sandwich-like structure, the components being arranged in layers above one another at a defined spacing and interspaces are filled with a plastic.

8. The method of claim 1 wherein the interspaces are filled out by gluing the components to suitable plastic foils.

9. The method of claim 1 wherein the interspaces are filled by an injection molding method.

10. The method of claim 1 wherein the interspaces are filled with expanded cellular material.

11. A piezo-electric transducer having a composite structure, which comprises at least the following sequence of layers: ceramic, electrode, plastic, and which
    electrode material is an intrinsically conductive plastic and constructed from a monomer consisting of a compound chosen from the group of materials consisting of: five-membered heterocyclenes; aniline; azulene; derivatives of five-membered heterocyclenes, aniline, and azulene containing an element chosen from the group consisting of sulfur and nitrogen as heteroatom.

12. The piezo-electric transducer of claim 11 wherein the monomer is polymerized by anodic oxidation.

13. The piezo-electric transducer of claim 12 wherein the anodic oxidation of the monomer ensues in the presence of a conducting salt.

14. The piezo-electric transducer of claim 13 wherein the conducting salt is chosen from the group consisting of organic sulfates, sulfonic acids, and inorganic salts.

15. The piezo-electric transducer of claim 11 wherein the monomer is polymerized by chemical oxidation.

* * * * *